(12) United States Patent
Einabad

(10) Patent No.: US 12,719,238 B2
(45) Date of Patent: Aug. 25, 2026

(54) CORRUGATED BURIED HETEROSTRUCTURE LASER AND METHOD FOR FABRICATING THE SAME

(71) Applicant: NATIONAL RESEARCH COUNCIL OF CANADA, Ottawa (CA)

(72) Inventor: Omid Salehzadeh Einabad, Orleans (CA)

(73) Assignee: NATIONAL RESEARCH COUNCIL OF CANADA, Ottawa (CA)

( * ) Notice: Subject to any disclaimer, the term of this patent is extended or adjusted under 35 U.S.C. 154(b) by 624 days.

(21) Appl. No.: 18/248,011

(22) PCT Filed: Dec. 11, 2020

(86) PCT No.: PCT/CA2020/051716
§ 371 (c)(1),
(2) Date: Apr. 5, 2023

(87) PCT Pub. No.: WO2022/073093
PCT Pub. Date: Apr. 14, 2022

(65) Prior Publication Data

US 2023/0378721 A1 Nov. 23, 2023

Related U.S. Application Data

(60) Provisional application No. 63/087,430, filed on Oct. 5, 2020.

(51) Int. Cl.
*H01S 5/227* (2006.01)
*H01S 5/12* (2021.01)
*H01S 5/32* (2006.01)

(52) U.S. Cl.
CPC .......... *H01S 5/2275* (2013.01); *H01S 5/1237* (2013.01); *H01S 5/2272* (2013.01); *H01S 5/3202* (2013.01); *H01S 5/227* (2013.01)

(58) Field of Classification Search
CPC ...... H01S 5/1237; H01S 5/227; H01S 5/2272; H01S 5/3202
See application file for complete search history.

(56) References Cited

U.S. PATENT DOCUMENTS 7,440,666 B2 * 10/2008 Bour .................. H01S 5/34313 385/129
2005/0084991 A1 4/2005 Lee et al.
(Continued)

FOREIGN PATENT DOCUMENTS

| | | | |
|---|---|---|---|
| EP | 0617471 | B1 | 9/2002 |
| EP | 1719003 | B1 | 8/2011 |
| KR | 20000050846 | A | 8/2000 |

OTHER PUBLICATIONS

International Search Report and Written Opinion dated Jun. 7, 2021 issued in corresponding international application No. PCT/CA2020/051716 by the Canadian Intellectual Property Office (8 pages).

*Primary Examiner* — Michael Carter
(74) *Attorney, Agent, or Firm* — ROBIC

(57) ABSTRACT

There is provided a method for fabricating a corrugated buried heterostructure laser, including patterning a dielectric layer coating a substrate having a <0-11> direction to obtain a hollow corrugated structure. The hollow corrugated structure includes a central portion and regularly spaced-apart tabs laterally extending from the central portion and aligned with the <0-11> direction. The method also includes, in a single metal organic chemical vapour deposition run, forming an active region in the hollow corrugated structure to obtain the corrugated buried heterostructure laser. The single run combines selective area growth, p-dopant diffusion and etching techniques. There is also provided a corrugated buried heterostructure laser including a substrate having a <0-11> direction, a corrugated structure defined in the substrate and including a central portion and regularly
(Continued)

spaced-apart tabs laterally extending from the central portion and aligned with the <0-11> direction, and an active region grown in the corrugated structure.

18 Claims, 6 Drawing Sheets

(56) References Cited

U.S. PATENT DOCUMENTS

| | | | |
|---|---|---|---|
| 2006/0221438 | A1 | 10/2006 | Akiyama |
| 2009/0154514 | A1 | 6/2009 | Oh et al. |

* cited by examiner

CORRUGATED BURIED HETEROSTRUCTURE LASER AND METHOD FOR FABRICATING THE SAME

CROSS-REFERENCE TO RELATED APPLICATIONS

This application is a filing under 35 U.S.C. § 371 of International Patent Application PCT/CA2020/051716, filed on Dec. 11, 2020, which claims priority to U.S. Provisional Application No. 63/087,430, filed on Oct. 5, 2020, each of which is incorporated by reference in its entirety.

TECHNICAL FIELD

The technical field generally relates to photonic devices, related systems, as well as methods for manufacturing the same. More particularly, the technical field relates to corrugated buried heterostructure lasers, related systems, and methods for fabricating the same.

BACKGROUND

A laser is a photonic device that emits light through an optical amplification process based on a stimulated emission of electromagnetic radiation. Corrugated buried heterostructure (C-BHet) lasers are a subclass of lasers. Fabrication of such lasers has been commonly carried out along the [011] direction of substrates, which is commonly referred to as the conventional direction of the substrate.

Existing fabrication processes are known to be complex and lengthy, as they can include three or four epitaxial growth steps, for example and without being limitative, metalorganic chemical vapour deposition (MOCVD) growth steps.

There is a need for techniques, methods, systems, and devices that address or mitigate at least some of the challenges presented above.

SUMMARY

In accordance with one aspect, there is provided a method for fabricating a corrugated buried heterostructure laser, the method including:

- coating a substrate with a dielectric layer, the substrate having a <0-11> direction;
- patterning the dielectric layer to obtain a hollow corrugated structure, the hollow corrugated structure including a central portion and regularly spaced-apart tabs laterally extending from the central portion, each regularly spaced-apart tab being aligned with the <0-11> direction of the substrate;
- etching, in situ, the hollow corrugated structure to form angles at corresponding edges thereof;
- diffusing, in situ, a p-dopant in the substrate to obtain a p-dopant distribution in a portion of the substrate, the p-dopant distribution having a distribution profile being provided by the angles formed at the corresponding edges of the hollow corrugated structure;
- etching, in situ, a portion of the p-doped substrate, thereby defining a tapered recess in the substrate;
- growing a n-blocking layer in the tapered recess;
- sequentially growing an active region over a portion of the n-blocking layer, a p-overclad over the active region, a p-contact over the p-overclad and a p-metal contact over the p-contact; and

- growing a n-metal contact on a backside of the substrate to obtain the corrugated buried heterostructure laser.

In some embodiments, the substrate is an n-type substrate.

In some embodiments, the n-type substrate is InP.

In some embodiments, the dielectric layer is a silicon oxide layer.

In some embodiments, the regularly spaced-apart tabs have a width ranging from about 2 μm to about 5 μm and length ranging from about 0.25 μm to about 1.5 μm.

In some embodiments, the regularly spaced-apart tabs have a period ranging from about 0.5 μm to about 1.5 μm.

In some embodiments, said patterning the dielectric layer further includes defining large openings in the dielectric layer, each large opening having a width ranging from about 50 μm to about 250 μm.

In some embodiments, the dielectric layer has a thickness ranging from about 1000 Å to about 15000 Å.

In some embodiments, said etching, in situ, the hollow corrugated structure is carried out using a shallow etch.

In some embodiments, said shallow etch includes etching the substrate for 1000 Å to about 15000 Å.

In some embodiments, said etching, in situ, the hollow corrugated structure includes using a precursor selected from methyl iodide, carbon tetrabromide, carbon chloride tetrabromide, carbon bromide trichloride and carbon tetrachloride.

In some embodiments, said diffusing, in situ, the p-dopant in the substrate includes diffusing Zn.

In some embodiments, the distribution profile has a vertical diffusion depth ranging from about 0.4 μm to about 1.0 μm.

In some embodiments, said diffusing, in situ, the p-dopant in the substrate is carried out using a ratio of lateral diffusion rate to vertical diffusion rate in the range of about 0.5 to about 1.0.

In some embodiments, the tapered recess has a vertical dimension ranging from about 0.7 μm to about 1.7 μm.

In some embodiments, said growing the n-blocking layer in the tapered recess includes growing an InP blocking layer.

In some embodiments, the n-blocking layer has a thickness ranging from about 0.5 μm to about 0.8 μm.

In some embodiments, said growing the active region includes growing at least one quantum well.

In some embodiments, said growing the active region includes growing a bulk material.

In some embodiments, said growing the active region includes growing quantum dots.

In some embodiments, said growing the p-overclad over the active region includes growing a p-InP layer or a InGaAs layer.

In some embodiments, the method further includes doping the InGaAs with Zn.

In some embodiments, the method further includes thinning the backside of the substrate before growing the n-metal contact thereon.

In accordance with another aspect, there is provided a method for fabricating a corrugated buried heterostructure laser, the method including:

- patterning a dielectric layer coating a substrate to obtain a hollow corrugated structure, the substrate having a <0-11> direction and the hollow corrugated structure including a central portion and regularly spaced-apart tabs laterally extending from the central portion, each regularly spaced-apart tab being aligned or parallel to the <0-11> direction of the substrate; and in a single metal organic chemical vapour deposition (MOCVD) run, forming an active region in the hollow corrugated structure to obtain the corrugated buried heterostructure laser, wherein said single MOCVD run combines selective area growth, p-dopant diffusion and etching techniques.

In accordance with another aspect, there is provided a corrugated buried heterostructure laser, including:

a substrate having a <0-11> direction;

a corrugated structure defined in the substrate, the corrugated structure including a central portion and regularly spaced-apart tabs laterally extending from the central portion, each regularly spaced-apart tab being aligned or parallel to the <0-11> direction of the substrate; and an active region grown in the corrugated structure.

Other features will be better understood upon reading of embodiments thereof with reference to the appended drawings.

DETAILED DESCRIPTION

Figure 1:
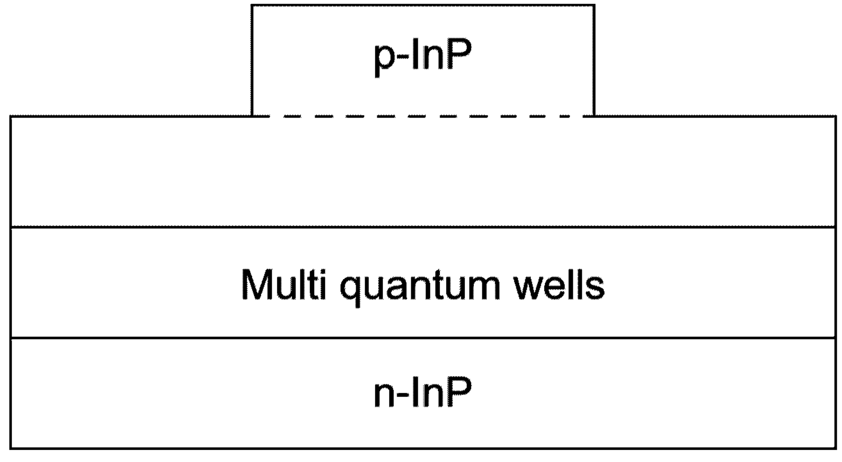
FIG. 1 (PRIOR ART) is an example of a shallow-ridge laser from prior art.

In the following description, similar features in the drawings have been given similar reference numerals. In order to not unduly encumber the figures, some elements may not be indicated on some figures if they were already mentioned in preceding figures. It should also be understood herein that the elements of the drawings are not necessarily drawn to scale and that the emphasis is instead being placed upon clearly illustrating the elements and structures of the present embodiments.

The terms “a”, “an” and “one” are defined herein to mean “at least one”, that is, these terms do not exclude a plural number of elements, unless stated otherwise. It should also be noted that terms such as “substantially”, “generally” and “about”, that modify a value, condition or characteristic of a feature of an exemplary embodiment, should be understood to mean that the value, condition or characteristic is defined within tolerances that are acceptable for the proper operation of this exemplary embodiment for its intended application.

In the present description, the terms “connected”, “coupled”, and variants and derivatives thereof, refer to any connection or coupling, either direct or indirect, between two or more elements. The connection or coupling between the elements may be mechanical, physical, optical, acoustical, operational, electrical, wireless, or a combination thereof.

In the present description, the terms “light” and “optical”, and any variants and derivatives thereof, are intended to refer to electromagnetic radiation in any appropriate region of the electromagnetic spectrum and are not limited to visible light. For example, in one embodiment, the terms “light” and “optical” may encompass electromagnetic radiation in one or more regions of the electromagnetic spectrum, such as, for example and without being limitative, the millimeter, terahertz, visible and ultraviolet regions, or any combinations thereof.

It will be appreciated that positional descriptors indicating the position or orientation of one element with respect to another element are used herein for ease and clarity of description and should, unless otherwise indicated, be taken in the context of the figures and should not be considered limiting. It will be understood that spatially relative terms (e.g., “away”, “vertical” and “horizontal”, “top” and “bottom”, “over”, “under”, “front” and “rear”, “behind”, “side” and the like) are intended to encompass different positions and orientations in use or operation of the present embodiments, in addition to the positions and orientations exemplified in the figures.

In the following description, the expressions “quantum well”, “QW” or “multi quantum wells” generally refer to a heterostructure in which charged carriers of at least one type (i.e., electrons and/or holes) are confined in one direction (typically out-of-plane) and free in the other two directions (typically the in-plane directions). Quantum confinement is a quantum property that emerges when a particle is localized in a volume that has at least one reduced lateral dimension, e.g., a few nanometers. In this situation, the energy of the particle becomes quantized in this direction.

The expression “device” refers to a component or an assembly associated with a functionality. For example, an “photonic device” is a device that can accomplish a specific functionality involving the use or manipulation photons and/or charges carriers.

Techniques and methods for fabricating a corrugated buried heterostructure laser (herein also referred to as a “C-BHet laser” or a “corrugated BHet laser”) using an integrated process are provided. Various embodiments of these techniques and methods will be described in greater detail after the following overview of some theoretical considerations.

General Theoretical Background

The fabrication of a corrugated BHet laser oriented along the direction of [0-11] of the substrate may be desirable in cases where a monolithic integration with photonic or optoelectronic component(s) is sought. A nonlimitative of such a photonic device is an optical modulator. However, existing methods for fabricating such a corrugated BHet laser remain challenging, as it will be outlined below.

The fabrication of a corrugated BHet laser along [0-11] direction could be achieved using conventional methods. Such conventional methods would however require four metalorganic chemical vapour deposition (MOCVD) growth steps. A base epitaxial growth, including n-InP, may be carried out, and an active region may be grown on an n-InP substrate. Then, after the grating formation, a blanket overgrowth may be carried out. After forming a narrow mesa via an ex-situ etching, a blocking layer may be grown via a selective area growth (SAG) process. Then, a blanket p-type overclad may be grown. Finally, a mesa may be formed via ex-situ etching followed by the metallization steps. In this method, the current confinement is achieved via the npnp blocking layers.

The conventional methods are not only complex and lengthy, they are also costly. In addition, the poor quality of the blocking layer(s) overgrown along the [0-11] direction has hindered the success of this method.

Techniques for fabricating a corrugated BHet laser along the [0-11] directed will herein be presented.

Corrugated Buried Heterostructure Laser

Techniques and methods to produce a corrugated BHet laser are provided. In accordance with one broad aspect, there is provided a method that combines SAG, in situ MOCVD p-dopant, such as Zn, diffusion and in situ etching techniques in a single MOCVD run to manufacture a corrugated BHet laser having lateral npnp blocking layers, as it will be described in greater detail below. In nearly all variants, the corrugated BHet lasers are based on III-V semiconductors.

The embodiments of the method for fabricating a corrugated BHet laser that will now be presented can be carried in a single continuous process, i.e., an in-situ process or integrated process, which can be, for example and without being limitative a single MOCVD process. The complexity associated with these embodiments is relatively low in comparison to conventional methods for fabricating such devices.

Figure 2:
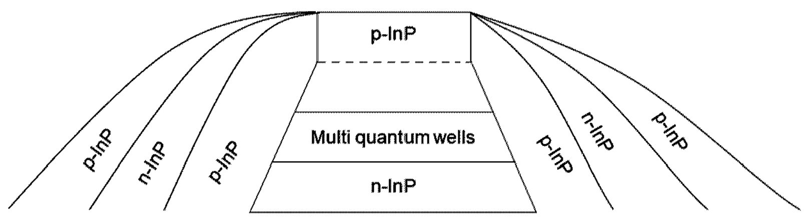
FIG. 2 (PRIOR ART) is an example of a BHet laser from prior art.

An example of a shallow-ridge laser from prior art is illustrated in FIG. 1 (PRIOR ART), and an example of a corrugated BHet laser from prior art is illustrated in FIG. 2 (PRIOR ART).

Figure 3:
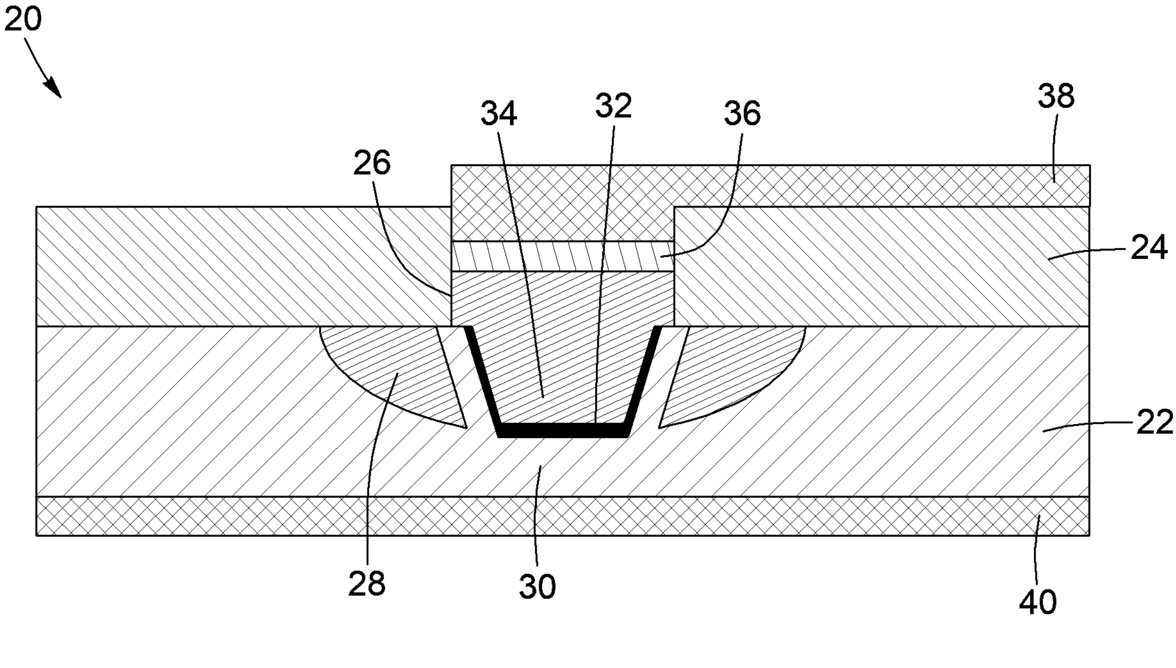
FIG. 3 illustrates an embodiment of a corrugated BHet laser.

An exemplary embodiment of a corrugated BHet laser 20 is shown in FIG. 3. As illustrated, the corrugated BHet laser 20 includes a substrate 22. In some embodiments, the substrate is an n-type substrate. A dielectric layer 24, which can be for example and without limitative an oxide layer, is provided on top of the substrate 22. The dielectric layer 24 includes patterns defining openings 26. The corrugated BHet laser 20 also includes a p-dopant distribution 28 in a portion of the substrate 22. In some embodiments, the p-dopant is Zn. As illustrated, the corrugated BHet laser 20 includes an n-blocking layer 30 that is provided in a region under the opening 26 defined by the patterns formed in the dielectric layer 24 and, in some embodiments, under a portion of the dielectric layer 24. An active region 32 is provided on at least a portion of the n-blocking layer 30. A p-overclad 34 is in contact with the active region 32 and a p-contact 36 is provided on top of the overclad 34. In the illustrated embodiment, the p-overclad 34 extends over the active region 32. The corrugated BHet laser 20 also includes a p-metal contact 38 extending over the p-contact 36 and a n-metal contact 40 provided on a backside of the corrugated BHet laser 20.

Referring to FIGS. 4(*a*)-(*h*), an embodiment of a method for fabricating the corrugated BHet laser 20 is illustrated.

The method includes a step of coating the substrate 22 with a dielectric layer 24. The substrate 22 has a [0-11] direction. A non-limitative example of the dielectric layer 24 is a silicon oxide ($SiO_x$). The dielectric layer 24 can be provided on the substrate 22 using coating and deposition techniques that are already known in the art. The substrate 22 is an n-type substrate, such as, for example and without being limitative, InP. It is to be noted that, in some embodiments, the method includes one or more precleaning steps before coating the substrate 22. Such precleaning steps may be useful to remove contaminants from the external surface of the substrate 22.

The step of coating the substrate 22 is followed by a step 100 of patterning the dielectric layer 24 to obtain a hollow corrugated structure (not shown in FIGS. 4(*a*)-(*h*). The hollow corrugated structure includes a central portion and regularly spaced-apart tabs laterally extending from the central portion, as it will be described in greater detail below. Each regularly spaced-apart tab is aligned with or substantially parallel to the [0-11] direction of the substrate 22.

Figures 4A, 4B, 4C, 4D, 4E, 4F, 4G, 4H:
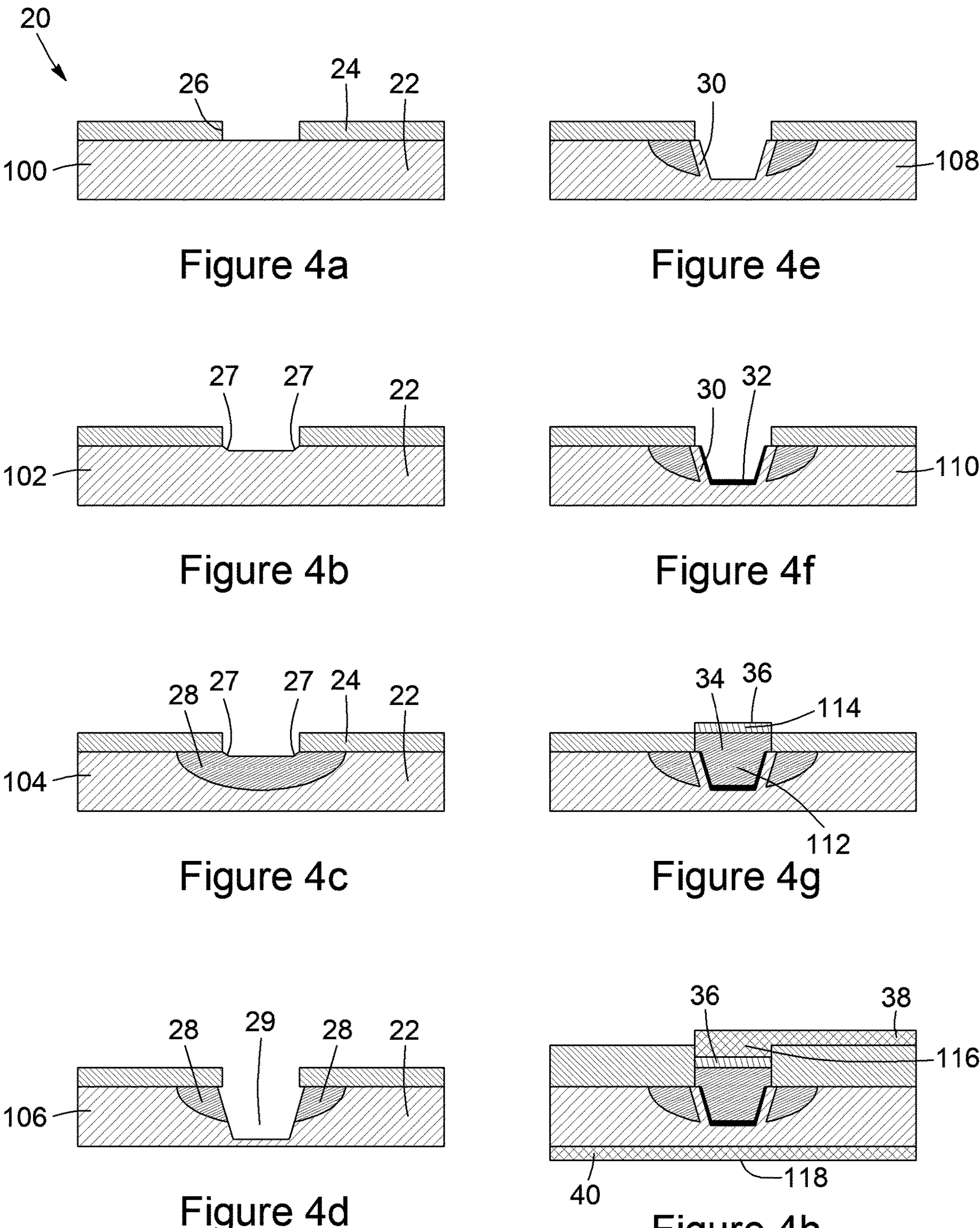
FIGS. 4(*a*)-(*h*) show the steps of a method for fabricating a corrugated BHet laser, in accordance with one embodiment.

Coating the substrate 22 with the dielectric layer 24 and patterning the dielectric layer 24 to obtain the hollow corrugated structure are made using common microfabrication techniques. For example, and without being limitative, the step 100 of patterning the dielectric layer 24 to obtain the hollow corrugated structure may include patterning a photoresist layer provided on top of the dielectric layer 24 and etching the same after its patterning. The dielectric layer 24 may be coated with a photoresist layer of positive photoresist or negative photoresist. A characteristic of the positive photoresist is that the portion of the positive photoresist that is exposed to light (e.g., through a photomask during an "exposition step") becomes soluble to a photoresist developer (i.e., during a "developing step"). Upon exposition to light through the photomask, the photo-sensitive material forming the positive photoresist will be degraded by light and the photoresist developer will dissolve the portions exposed to light, whereas the blocked or unexposed portions of the photoresist remain insoluble to the photoresist developer After exposition and development of the positive photoresist, the patterns provided therein are thus a copy of the mask. A characteristic of the negative photoresist is that the portion of the negative photoresist that is exposed to light (i.e., through the photomask during the "exposition step") becomes insoluble to the photoresist developer (i.e., during the "developing step"). Upon exposition to light through the photomask, the photo-sensitive material forming the negative photoresist will be cross-linked or polymerized by light and the photoresist developer will dissolve the blocked portions or portions unexposed to light, whereas the exposed portions of the photoresist remain insoluble to the photoresist developer. After exposition and development of the negative photoresist, the patterns provided therein are thus complementary to the mask. The photoresist, positive or negative, can be spin-coated on the dielectric layer core or could alternatively be coated or deposited with other deposition techniques. In a typically spin-coating step, a few milliliters of the photoresist are placed, poured or dispensed on the dielectric layer. A rotational movement is then imparted to the substrate 22 having the dielectric layer 24 thereon and a rotational speed equal to or greater than 1000 rpm can be reached. The centrifugal force due to the rotation of the substrate 22 spreads the dispensed photoresist into a thin film of substantially uniform thickness and the excess is spun off the edge of the substrate 22 and dielectric layer 24. Part of the solvent contained in the photoresist may evaporate from the photoresist layer during the rotation of the substrate. The photoresist layer is then exposed to electromagnetic radiation through openings provided in a photomask placed above the photoresist layer. Of note, electron beam lithography could alternatively be used. As in most microfabrication process, the electromagnetic radiation is in the UV range. In some embodiments, exposing the photoresist layer to electromagnetic radiation comprises illuminating the photoresist layer with a beam having at least one ultraviolet spectral line. In some embodiments, the spectral line comprises 436 nm, 405 nm and 365 nm. After the exposition of the photoresist layer, the photoresist layer is developed in an appropriate solvent. In some embodiments, remaining portions of the photoresist layer after the development can be thermally treated in order to harden the same. In some embodiments, the remaining portions can be hardened using deep ultra-violet (DUV) radiation. Once the development of the photoresist is complete, a step of etching the exposed portions of the dielectric layer, which is followed by a step of stripping off the remaining portions of the photoresist layer, thus resulting in the dielectric layer having openings defined therein and portions of the substrate being uncovered, namely the uncovered regions. An example of the dielectric layer 24 coating the substrate 22 is illustrated in FIG. 4A. In some embodiments, the thickness of the dielectric layer 24, is in the range of about 1000 Å to about 15000 Å.

Figure 5:
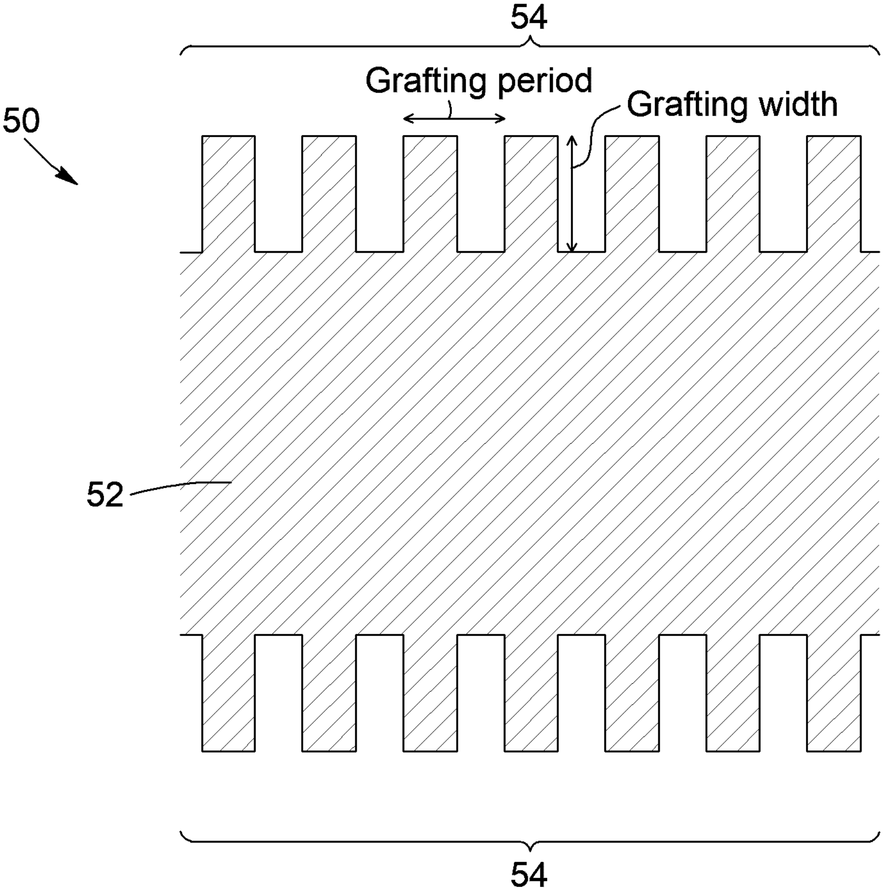
FIG. 5 illustrates a layout of a dielectric mask used to fabricate a corrugated BHet laser, in accordance with one embodiment.

An example of the layout of a dielectric mask 50 is illustrated in FIG. 5. As illustrated, the dielectric mask 50 includes a central portion 52 and regularly spaced-apart tabs 54 laterally extending from the central portion 52. In some embodiments, the regularly spaced-apart tabs 54 have a width ranging from about 2 μm to about 5 μm and length ranging from about 0.25 μm to about 1.5 μm. In some embodiments, the regularly spaced-apart tabs 54 have a period (sometimes referred to as a "grating period") ranging from about 0.5 μm to about 1.5 μm.

In some embodiments, patterning the dielectric layer 24 may further include defining large openings in the dielectric layer 24 for controlling the overall growth rate. Each large opening may have a width ranging from about 50 μm to about 250 μm. In these embodiments, two sets of windows are defined: a first set of narrow windows or openings (formed between the tabs 54 and defining lateral corrugated features or structures) for the growth of the device structure having a width in the range of about 2 μm to about 5 μm and a second set of large windows or openings having a width in the range of about 50 μm to about 250 μm to adjust or control the overall growth rate during the SAG step(s). The distance separating the first set of narrow windows or openings and the second set of large windows or openings may be in the range of about 25 μm to about 250 μm. It will be noted that the width the first set of windows or openings may be laterally modulated to form second and third order gratings. In some embodiments, the grating period may be in the range of about 0.5 μm to about 1.5 μm.

Once the hollow corrugated structure is obtained, a step 102 of etching, in situ, the hollow corrugated structure of the substrate 22 to form angles 27 is carried out.

The angles 27 may be supplementary, i.e., their sum can be 180°. In the context of the current description, the angles 27 are measured in a direction aligned a vector parallel to the surface of the substrate 22. This step 102 could be referred as a "shallow etch step", as the depth of this etching is relatively small. Indeed, the aim of this in situ etching is to form the angles 27 in the substrate 22 below the dielectric layer 24, rather than etching the substrate 22. In some embodiments, the depth of the shallow in situ etching is in the range of about 0.1 μm to about 0.5 μm. Non-limitative examples of precursors that can be used for this step 102 are methyl iodide, carbon tetrabromide, carbon chloride tetrabromide, carbon bromide trichloride, carbon tetrachloride and other precursors that are compatible with MOCVD technologies. An example of the result of this step 102 is illustrated in FIG. 4B.

With reference to FIG. 5, it is to be noted that the regularly spaced-apart tabs 54 are generally aligned along the [0-11] direction of the substrate 22.

Referring back to FIGS. 4(*a*)-(*h*), the step 102 is followed by a step 104 of diffusing, in situ, a p-dopant in the substrate 22 to obtain a p-dopant distribution 28 in a portion of the substrate 22. This step 104 is illustrated in FIG. 4C. In some embodiments, the p-dopant is Zn. The portion of the substrate 22 is generally aligned with the patterns defined in the substrate 22, but also extends, in some implementations, under at least a portion of the dielectric layer 24. The p-dopant distribution 28 has a distribution profile that is provided by the angles 27. The p-dopant distribution 28 could either be isotropic or anisotropic. In the first case, the ratio of lateral to vertical diffusion rate is approximately the same, whereas, in the second case, the ratio of lateral to vertical diffusion rate is relatively different. In some embodiments, the diffusion depth (i.e., vertical direction) may be in the range of about 0.4 μm to about 1.0 μm. In some embodiments, the ratio of lateral to vertical diffusion rate may be in the range of about 0.5 to about 1.0. Of note, the ratio of lateral to vertical rate depends at least on the diffusion conditions and the shallow etching depth carried out in the prior step 102. For instance, the presence of the angles 27 may generally increase the lateral diffusion rate of the p-dopant (with respect to the vertical diffusion rate).

Now referring to FIG. 4D, the method also includes a step 106 of etching, in situ, a portion of the p-doped substrate, thereby defining a tapered recess 29 in the substrate 22. In some embodiments, the depth (i.e., vertical dimension) of this in-situ etching is in the range of about 0.7 μm to about 1.7 μm. Unetched portion(s) of the p-doped substrate can be seen in FIG. 4D. As illustrated, the dimensions of the tapered recess 29 may be different (e.g., smaller) that the distribution profile of the p-dopant. In the illustrated embodiment, the distribution profile of the p-dopant has a semi-circular or semi-elliptical cross-section and the tapered recess 29 has a truncated v-shaped cross-section. The result of the etching of the truncated v-shaped cross-section in the semi-elliptical cross-section of the distribution profile of the p-dopant is two p-dopant regions each having a cross-section having a shape resembling a fin, the two p-dopant regions being located on a respective side of the tapered recess 29.

The method 20 then includes subsequent growth steps 108 to 114, as illustrated in the non-limitative embodiment of FIGS. 4E-H. An n-blocking layer 30 may be grown in the tapered recess 29 in step 108. A non-imitative example of an n-blocking layer 30 is an n-InP layer. In some embodiments, the thickness of the n-blocking layer 30 is in the range of about 0.5 μm to about 0.8 μm. While various n-doping levels can be achieved, the n-doping level of the n-blocking layer 30 typically ranges from about 6e17 $cm^{-3}$ to about 2e18 $cm^{-3}$. The method 20 also includes a step 110 of growing an active region 32 over at least a portion of the n-blocking layer 30. It is to be noted that the active region 32 is electronically and/or optically active and could be made from a broad variety of architectures, designs, structures and/or materials. For example, and without being limitative, the active region 32 could be in the form of a bulk material, multi-quantum wells, quantum dots or a combination thereof. The refractive index of the active region 32 may be larger and, in some implementations, much larger than the refractive index of its surrounding, thus enabling the required optical confinement for the device to operate. A p-overclad 34 may be grown over the active region 32 in step 112. The p-overclad 34 may be, for example and without being limitative, epitaxially grown. A non-limitative of the material forming the p-overclad 34 is p-InP. The p-doping of can be achieved, for example and without being limitative, using Zn or any other appropriate dopants. While various doping levels could be used, the p-doping level of the p-overclad 34 is in the range of about 5e17 $cm^{-3}$ to about 2e18 $cm^{-3}$. The method then includes a step 114 of a growing a p-contact 36 above the p-overclad 34. The p-contact 36 can be, for example and without being limitative, made from InGaAs. The doping level of the p-contact layer 36 is in the range of about 1e19 $cm^{-3}$ to about 2e19 $cm^{-3}$. A p-metal contact 38 is then grown over the p-contact 36 in step 116, and an n-metal contact 40 is grown on a backside of the substrate to obtain the corrugated BHet laser in step 118.

Figure 6:
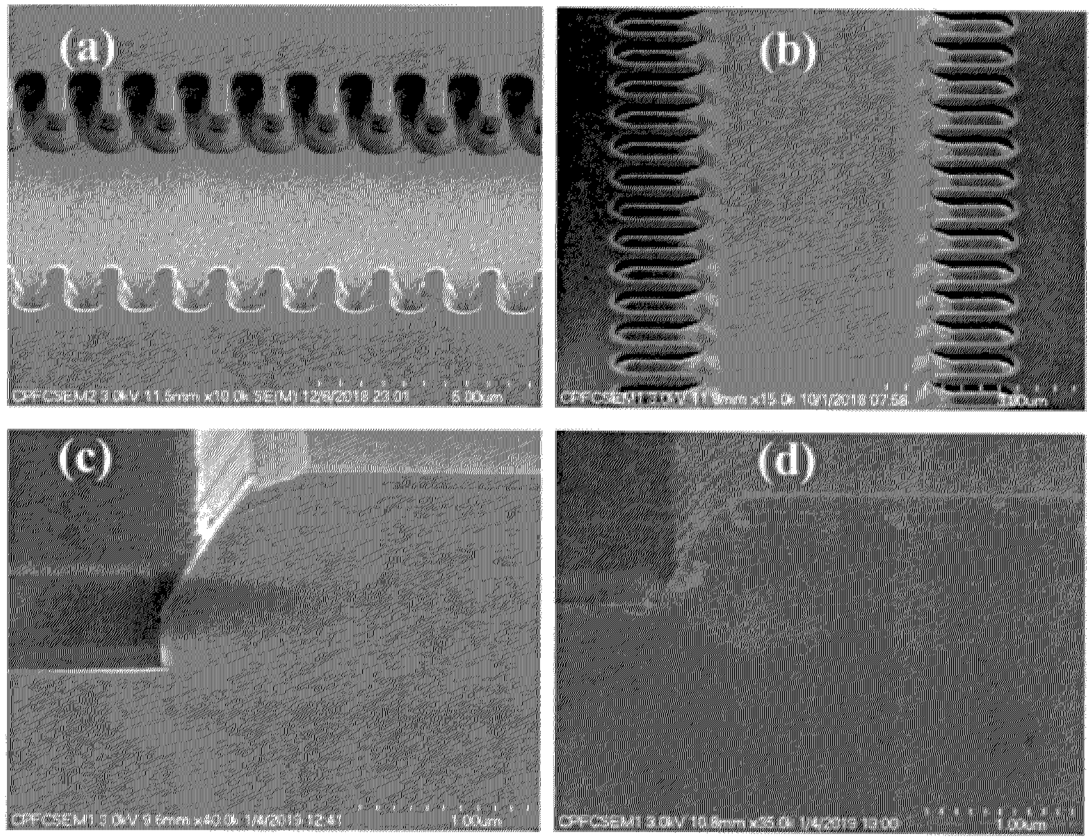
FIGS. 6(*a*)-(*d*) show a 45° tilt SEM image of (a) a corrugated structure after MOCVD in situ etching and (b) the corrugated structure after a complete MOCVD growth process; and a cross-section SEM image after a complete MOCVD growth process of a corrugated BHet laser c) with lateral npnp lateral blocking layers, and d) a corrugated BHet laser without lateral npnp lateral blocking layers.

A schematic representation of the obtained device is illustrated in FIGS. 3 and 4H. SEM images of structures fabricated according to the present method are shown in FIGS. 6(*a*)-(*d*). As illustrated in FIG. 6(*c*), the presence of lateral npnp layer may be useful to provide an appropriate lateral confinement. As such, a semiconductor-based blocking layer can be implemented in a corrugated BHet laser to effectively minimize lateral current leakage. It is to be noted that the device can be obtained in a single MOCVD run by employing a combination of SAG and in situ etching and growth, such as the ones which have been previously described.

The fabricated device includes corrugated lateral features or structures that are interdigitated with portion(s) of the substrate 22 surrounding the active region 32, see for example FIGS. 4(*b*)-(*d*).

Now turning to FIGS. 6(*a*)-(*d*), there is illustrated various 45° tilt SEM images. In FIG. 6(*a*), a corrugated structure after MOCVD in situ etching, resulting from the step 106 which has been previously described, is shown. FIG. 6(*b*) illustrates a corrugated structure after a complete MOCVD growth process, i.e., after the step 114 having been previously described. FIG. 6(*c*) shows a cross-section SEM image after a complete MOCVD growth process of a corrugated BHet laser. The depicted embodiments of the corrugated BHet laser includes lateral npnp lateral blocking layers. FIG. 6 (*d*) illustrates an embodiment of a corrugated BHet laser without lateral npnp lateral blocking layers.

Figure 7:
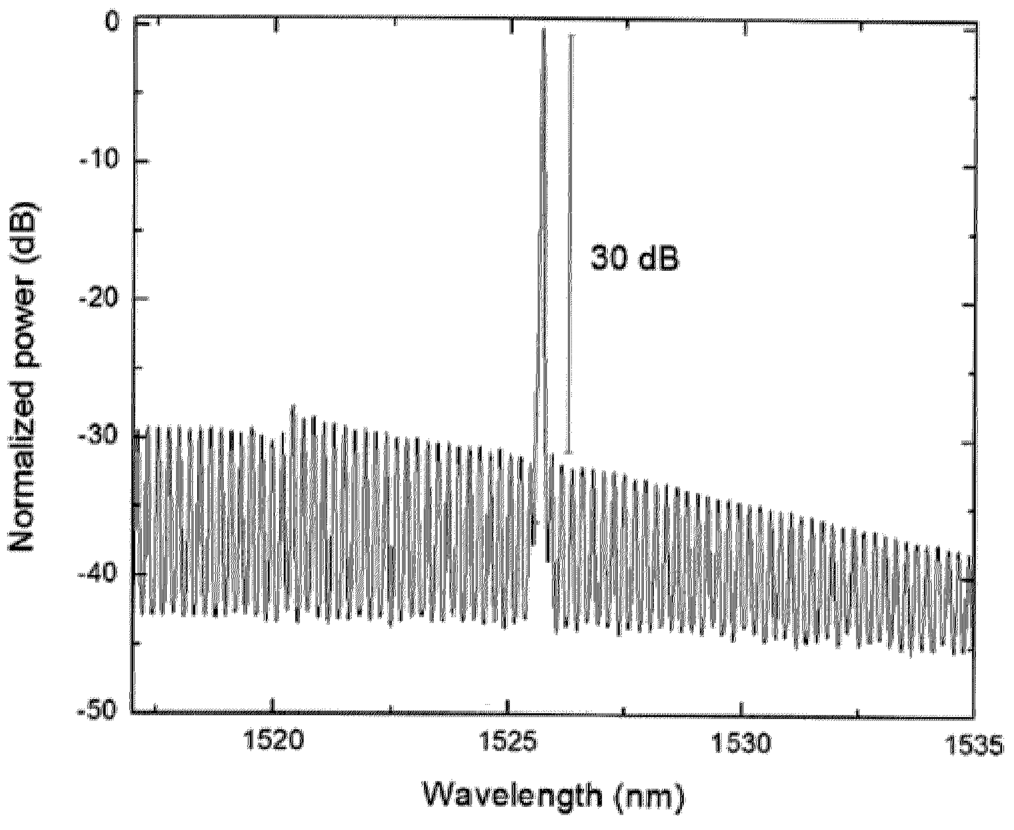
FIG. 7 illustrates a spectral power distribution of a corrugated BHet laser fabricated according to the steps presented in FIGS. 4(*a*)-(*h*).

The fabricated devices may then be tested, and their spectral response may be characterized. For example, the spectral power distribution of the corrugated BHet laser fabricated by the methods having herein been described are illustrated in FIG. 7.

One advantage associated with the embodiments of the method described herein is that they result in devices having lateral current blocking layers, which is at least partially due to the methods relying on SAG, p-dopant (e.g., Zn) diffusion and in situ etching step(s) in a single MOCVD run.

In some embodiments, the methods provided herein can be adapted so that the active region or core is not buried into the substrate, but is rather above the substrate, i.e., protruding therefrom. In such embodiments, the active region is surrounded by the p-overclad material. In this embodiment, the method includes all the steps illustrated in FIGS. 4A-H, except for the steps illustrated in FIGS. 4B-D.

Example of an Implementation

Now that several embodiments of techniques for fabricating a C-BHet laser have been presented, a nonlimitative exemplary implementation will now be presented.

An n-substrate, such as, for example and without being limitative InP or other III-V substrates, may be covered with a dielectric layer such as, for example and without being limitative, $SiO_x$. The dielectric layer may have a thickness in the range of 1000 Å to 15000 Å. The substrate may then be patterned to open two sets of widows. A first set of windows includes narrow openings, for the growth of the device structure. The narrow openings may have a width in the range of 4 μm to 5 μm. A second set of windows may include wide openings for adjusting the overall growth rate. The opening size of the wide openings may be in the range of 50 μm to 250 μm. The separation between the narrow and the wide openings may be in the range of 25 μm to 250 μm. Of note, the width of the narrow openings may be laterally modulated to form lateral second and third order gratings. The grating period may be in the range of 0.5 μm to 1.5 μm, and the grating length in the range of 0.25 μm to 1.5 μm. The stipes are generally oriented along or aligned with the [0-11] direction.

The substrate may then be loaded into a semiconductor growth tool such as, for example and without being limitative, a MOCVD reactor after a preclean process. Prior to a Zn diffusion process, a shallow in situ etching may be carried out using ethyl iodide. Alternatively, methyl iodide, carbon tetra-bromide, carbon tetrachloride or carbon bromide tri-chloride could be used for the in-situ etching. The depth of the in-situ etching may be in the range of 0.1 μm to 0.5 μm. This step is required to control the ratio of the lateral to vertical diffusion rate in the subsequent step.

Following the previous steps, the Zn diffusion may be carried out. The Zn diffusion depth may be in the range of 0.4 μm to 1.0 μm. The ratio of lateral to vertical diffusion rate is typically in the range of 0.5 to 1.0, depending on the diffusion conditions and the shallow diffusion depth carried out in the prior step.

After the Zn diffusion, an in-situ etching step may be carried out. The depth of the in-situ etching may be in the range of 0.7 μm to 1.7 μm.

After the in-situ etching step, an n-blocking layer, such as, for example and without being limitative, n-InP, may be grown. The thickness of the n-blocking layer may be in the range of 0.5 μm to 0.8 μm and the n-doping level may be in the range of 6e17 $cm^{-3}$ to 2e18 $cm^{-3}$.

After the growth of the n-blocking layer, an active region may be grown. The active region may be in the form of a bulk layer, multi-quantum well(s) or quantum dot(s).

As a final epitaxial step, a p-overclad, such as, for example and without being limitative, p-InP, and a p-contact, such as, for example and without being limitative, InGaAs, layers may be grown. The p-doping may be achieved using Zn or any appropriate dopant(s). The doping level of the overclad may be in the range of 5e17 $cm^{-3}$ to 2e18 $cm^{-3}$, and the doping level of the contact layer may be in the range of 1e19 $cm^{-3}$ to 2e19 $cm^{-3}$.

In order to complete the fabrication process, after depositing dielectric and opening vias over the contact layer in the device region, a p-metal contact may be deposited on the contact layer. Finally, after thinning the wafer, an n-metal contact may be deposited on the backside of the wafer. In the case of using a semi-insulating substrate, the n-contact may be defined on the top surface.

The fabricated devices may then be tested, and their spectral response may be characterized.

In one alternative embodiment, a C-BHet laser may be fabricated without incorporating lateral npnp junctions. In this process, some of the steps described above may be omitted from the process.

In another alternative embodiment, a C-BHet laser structure having an active core or region that is not buried into the substrate may be fabricated. Instead, the active core or region may be above the substrate or surface thereof, and may be surrounded by a p-overclad material. In this process, some of the steps described above may be omitted from the process.

Several alternative embodiments and examples have been described and illustrated herein. The embodiments described above are intended to be exemplary only. A person skilled in the art would appreciate the features of the individual embodiments, and the possible combinations and variations of the components. A person skilled in the art would further appreciate that any of the embodiments could be provided in any combination with the other embodiments disclosed herein. The present examples and embodiments, therefore, are to be considered in all respects as illustrative and not restrictive. Accordingly, while specific embodiments have been illustrated and described, numerous modifications come to mind without significantly departing from the scope defined in the appended claims.

The invention claimed is:

1. A method for fabricating a corrugated buried heterostructure laser, the method comprising:

- coating a substrate with a dielectric layer, the substrate having a <0-11> direction;
- patterning the dielectric layer to obtain a hollow corrugated structure, the hollow corrugated structure comprising a central portion and regularly spaced-apart tabs laterally extending from the central portion, each regularly spaced-apart tab being aligned with the <0-11> direction of the substrate;
- etching, in situ, the hollow corrugated structure to form angles at corresponding edges thereof;
- diffusing, in situ, a p-dopant in the substrate to obtain a p-dopant distribution in a portion of the substrate, the p-dopant distribution having a distribution profile being provided by the angles formed at the corresponding edges of the hollow corrugated structure;
- etching, in situ, a portion of the p-doped substrate, thereby defining a tapered recess in the substrate;
- growing a n-blocking layer in the tapered recess;
- sequentially growing an active region over a portion of the n-blocking layer, a p-overclad over the active region, a p-contact over the p-overclad and a p-metal contact over the p-contact; and
- growing a n-metal contact on a backside of the substrate to obtain the corrugated buried heterostructure laser.

2. The method of claim 1, wherein the substrate is an n-type substrate.

3. The method of claim 1, wherein the dielectric layer is a silicon oxide layer.

4. The method of claim 1, wherein the regularly spaced-apart tabs have a width ranging from about 2 μm to about 5 μm and length ranging from about 0.25 μm to about 1.5 μm.

5. The method of claim 1, wherein the regularly spaced-apart tabs have a period ranging from about 0.5 μm to about 1.5 μm.

6. The method of claim 1, wherein said patterning the dielectric layer further comprises defining large openings in the dielectric layer, each large opening having a width ranging from about 50 μm to about 250 μm.

7. The method of claim 1, wherein the dielectric layer has a thickness ranging from about 1000 Å to about 15000 Å.

8. The method of claim 1, wherein said etching, in situ, the hollow corrugated structure is carried out using a shallow etch, wherein said shallow etch comprises etching the substrate for 1000 Å to about 15000 Å.

9. The method of claim 1, wherein said etching, in situ, the hollow corrugated structure comprises using a precursor selected from methyl iodide, carbon tetrabromide, carbon chloride tetrabromide, carbon bromide trichloride and carbon tetrachloride.

10. The method of claim 1, wherein said diffusing, in situ, the p-dopant in the substrate includes diffusing Zn.

11. The method of claim 1, wherein the distribution profile has a vertical diffusion depth ranging from about 0.4 μm to about 1.0 μm.

12. The method of claim 1, wherein said diffusing, in situ, the p-dopant in the substrate is carried out using a ratio of lateral diffusion rate to vertical diffusion rate in the range of about 0.5 to about 1.0.

13. The method of claim 1, wherein the tapered recess has a vertical dimension ranging from about 0.7 μm to about 1.7 μm.

14. The method of claim 1, wherein said growing the n-blocking layer in the tapered recess comprises growing an InP blocking layer.

15. The method of claim 1, wherein the n-blocking layer has a thickness ranging from about 0.5 μm to about 0.8 μm.

16. The method of claim 1, wherein said growing the active region comprises one of: growing at least one quantum well, growing a bulk material, and growing quantum dots.

17. The method of claim 1, wherein said growing the p-overclad over the active region comprises growing a p-InP or an InGaAs layer.

18. The method of claim 1, further comprising thinning the backside of the substrate before growing the n-metal contact thereon.

* * * * *